United States Patent [19]
Tanielian et al.

[11] Patent Number: 5,102,506
[45] Date of Patent: Apr. 7, 1992

[54] ZINC-BASED MICROFUSE

[75] Inventors: Minas H. Tanielian, Bellevue; Chung-Ping Chien, Redmond, both of Wash.

[73] Assignee: The Boeing Company, Seattle, Wash.

[21] Appl. No.: 683,349

[22] Filed: Apr. 10, 1991

[51] Int. Cl.⁵ ............................................. C25D 5/02
[52] U.S. Cl. .................................... 205/118; 205/183
[58] Field of Search ......................... 204/15, 38.4

[56]  References Cited
U.S. PATENT DOCUMENTS

| | | | |
|---|---|---|---|
| 3,169,892 | 2/1965 | Lemelson | 148/6.3 |
| 3,261,082 | 7/1966 | Maissel et al. | 29/155.7 |
| 3,404,032 | 10/1968 | Collins | 117/212 |
| 3,457,636 | 7/1969 | Ireland et al. | 29/620 |
| 3,634,202 | 1/1972 | Michelet | 204/15 |
| 4,617,723 | 10/1986 | Mukai | 29/576 |
| 4,661,214 | 4/1987 | Young | 204/15 |
| 4,670,970 | 6/1987 | Bajor | 29/584 |

Primary Examiner—T. M. Tufariello
Attorney, Agent, or Firm—Christensen, O'Connor, Johnson & Kindness

[57]  ABSTRACT

A zinc-based temporary electrical connection (e.g., a microfuse) useful in electroplating isolated conductor (i.e., copper) structures and copper/polyimide high-density interconnect structures are disclosed. The microfuse includes a zinc conductor layer, and in some embodiments, additional silicon adhesion and silicon protection layers. The microfuse is conductive, and therefore useful in an electroplating process, until it is treated (e.g., heated to about 400° C. for one hour), to convert it into an insulator due to zinc oxidation, and remains in this state.

15 Claims, 7 Drawing Sheets

ZINC-BASED MICROFUSE

FIELD OF THE INVENTION

This invention relates to methods of temporarily electrically connecting conductors, which methods may be used to produce high reliability, planar metal/dielectric high-density interconnect structures, and to structures resulting from these methods.

BACKGROUND OF THE INVENTION

The availability of high speed integrated circuit chips has resulted in a need for suitable interconnection technology that offers high wiring density, good electrical characteristics for the propagation of high speed signals, and good thermal performance. Multilayer interconnection systems with fine line conductors and associated ground planes have been proposed for applications in high performance systems. C. W. Ho et al., *IBM J. Res. Dev.*, 26:286-296 (May 1982), and C. W. Ho et al., *VLSI Electronics: Microstructure Science*, 5(3):103-143 (Academic, New York, 1982). Fine geometry copper conductor lines defined in a photolithographically patterned layer of a low-dielectric constant polymer, such as a polyimide, have emerged as a versatile packaging approach for the conductive interconnection lines between densely packed integrated circuit chips in high performance systems.

One prior approach to fabricating interconnect structures uses copper conductor lines that are several microns thick. The metal is deposited using a thin film technique and is subsequently patterned using a resist mask. A wafer substrate with the patterned conductor lines is then spin-coated with a dielectric (e.g., polyimide). Planarity of the overall layer, which is of crucial importance for good performance and manufacturing yield, is poor unless one employs multiple coats of the dielectric film. The process is tedious and due to the presence of thick dielectric films, the interconnect structures are subjected to high levels of stress, resulting in poor yields and lowered reliability.

An alternative approach, which circumvents the limitations of the approach described above, uses photosensitive polyimide as the dielectric. In this approach, the polyimide film is photopatterned to create trenches into which the copper conductor lines are electroplated to a height equal to the polyimide film thickness, thus assuring near perfect planarity of all the individual signal layers. See K. K. Chakravorty, *Proc. of Elect. Comp. Conf.*, 135-142 (1988); and Chakravorty et al., *Proc. 3rd Int. SAMPLE Elec. Conf.*, 3:1213-1223 (1988).

In general, the alternative approach utilizes the following steps to produce conductive features having fine geometry: (1) depositing a thin layer of a base metal layer (also referred to as a metallic seed layer) on a dielectric substrate, (2) patterning the base metal layer to form fine geometry lines that serve as the electroplating base for the conductor lines, (3) spin-coating a layer of a photosensitive dielectric (e.g., photosensitive polyimide) over the dielectric substrate and patterned base metal layer, (4) photolithographically patterning the layer of the photosensitive dielectric to form dielectric features (defined by trenches) having fine geometry, and also uncovering the base metal layer at the bases of the features, and (5) electroplating an electrically conductive material between the patterned dielectric features onto the base metal layer to form electrically conductive features.

The alternative approach requires the presence of an electroplating base metal layer in the polyimide trenches, which needs to be electrically connected to the cathode of the electroplating bath during step (5), described above. A typical multichip module substrate may use a design such that it is not possible to extend every interconnection line to the edge of the module so as to electrically connect it to the cathode of the electroplating bath. In order to make this alternative approach work under such conditions, a technique is required whereby the "isolated" lines may be electrically connected to the edge and, thus, the cathode of the bath during the electroplating step. Upon completion of the plating process, the electrical connection may then be severed, restoring the electrical isolation of the conductor lines. This approach can be used for each layer in a multilayer high-density interconnect structure.

There are a few known ways of forming these temporary electrical connections to the outer edge of the substrate so that electroplating of "isolated" lines can be carried out. One such method is disclosed in U.S. Pat. No. 4,661,214 (Young). The Young patent proposes a type of microfuse that remains electrically conductive during normal processing temperatures but upon heating to a higher temperature, the material forming the fuse is transformed into an electrically insulating state. The Young patent proposes a silver/silver halide or silver/chalcogenide system as a thin film microfuse. The activation mechanism to electrically disconnect the thin film silver/silver halide microfuse is based on thermal interdiffusion between the silver and silver halide, which causes the insulating silver halide layer to absorb the metal film, thereby breaking the electrical connection. However, this interdiffusion mechanism imposes several limitations which influence its performance:

Control of the stoichiometric composition of the silver halide or chalcogenide film is difficult. Such control is important because the stoichiometry affects the temperature of disconnection.

Step coverage is a problem. Only thin films of silver can be used; otherwise, the structure may not disconnect. The disconnection of thicker layers is very difficult because it is controlled by the silver gradient and the diffusion coefficient.

The thickness of each component must be stringently controlled to ensure completion of thermal intermixing and hence, disconnection, at the proper temperature.

Chlorine based by-products generated in final heating or irradiation may cause corrosion.

Finally, the silver film adheres poorly.

Another approach to fabricating high-density multilayer interconnect structures involving interconnection of structures during the electroplating process followed by their isolation, was disclosed by Chakravorty and Tanielian in U.S. Ser. No. 520,174, filed on May 7, 1990. In this method, a blanket tantalum layer is used to electrically connect all of the electroplating seed layers to the edge of the wafer. Also, a dense anodic tantalum oxide layer is grown on the top of the tantalum layer. Upon completion of an electroplating process, excess tantalum/tantalum oxide layer is etched off to render the lines electrically isolated once again.

In spite of the above methods, there has remained a need for new and improved methods of temporarily electrically connecting conductors, such as plating seed layers to enable electroplating of conductor lines. In particular, there is a need for a new type of microfuse that does not suffer from the deficiencies of the Young patent.

It is therefore an object of the present invention to provide a new disconnect system to overcome limitations in prior approaches and/or to provide an alternative to prior methods.

It is also an object of the present invention to provide new methods for electrically isolating conductive features on a substrate.

It is yet another object of the present invention to provide methods of fabricating layers of multilayer high-density interconnect structures.

It is yet another object of the present invention to provide interconnect structures and multichip modules by way of an electroplating method that does not suffer from the drawbacks of prior approaches involving temporary electrical connections.

The above and other objects as will hereinafter become more readily apparent, have been achieved by the present invention, which is based on the discovery that a zinc layer can be utilized to temporarily electrically connect conductors. In a preferred embodiment, a zinc conductor layer is utilized in accordance with the present invention to temporarily connect seed layers on a substrate to enable electroplating of conductive features to be carried out, followed by electrically isolating the conductive features by converting the zinc layer into an insulating state. Conversion of the zinc layer to the insulating state may be accomplished by heating or by irradiation with energy in the form of a laser beam, and the like. Because of the function of the zinc layer and the typical small dimensions of interconnect structures, the zinc layer herein acts as a microfuse.

In a preferred embodiment of the present invention, the microfuse includes an adhesion layer, which enhances adherence of the zinc layer to the substrate and the base metal layer, and a protection layer coating the zinc layer, which protects the conductor layer from side reactions that diminish conductivity of the zinc layer prior to the desired conversion to an insulating state. When heating is used to convert the zinc layer to an insulating layer, the zinc layer is intended to be conducting, and therefore usable in an electroplating process, until it is heated to about 400° C. for at least about one hour. Preferably, the adhesion and protection layers both comprise silicon; therefore, a microfuse made up of all three layers may be referred to as a Si/Zn/Si microfuse.

As noted above, the inventive methods involve electrical disconnection by converting a conductive zinc layer into an insulating layer comprising zinc oxide. Zinc oxide has a very high glass transition temperature so it is thermodynamically very stable. This leads to long term reliability for the overall interconnect system.

Other objects, features, applications, and advantages of the present invention will be readily apparent from the following description of certain preferred embodiments thereof, taken in conjunction with the accompanying drawings. It is to be understood that variations and modifications may be effected without departing from the spirit and scope of the novel concepts of the disclosure herein.

DETAILED DESCRIPTION OF PREFERRED EMBODIMENTS OF THE INVENTION

In broad terms, the present invention provides a means for disconnecting conductors on a substrate. Thus, whenever it is anticipated that it may be necessary subsequently to disconnect pairs of conductors separated by gaps or spaces between them, at least a portion of the spaces or gaps is filled with a microfuse comprising zinc metal to thereby electrically connect the pairs of conductors. When it is desired to electrically disconnect the pairs of conductors that are connected by the zinc microfuses, the zinc layers are changed from a conductive state to an insulating state by application of thermal energy, such as by heating, or by irradiation of the zinc layer with a laser beam, or the like.

While not wishing to be limited to a particular theory of operation, it is believed that the primary way in which the zinc layer is converted to an insulating layer is by way of substantial conversion of the zinc metal to zinc oxide.

Once the zinc layers have been converted into an insulating state, the pairs of conductors that were originally electrically connected by way of the zinc layers are electrically isolated from each other. Because the zinc layers provide for temporary electrical connection between pairs of conductors, the zinc layers act as fuses.

It will be apparent from the above discussion that the conductors that are maintained in electrical contact by the zinc layers should not themselves be made out of zinc. Preferably, these conductors will be made out of copper.

Generally, the conductors of the present invention will be situated on a substrate, such as a silicon wafer or an oxidized silicon wafer. The substrate is preferably a dielectric substrate that is consistent with the formation of a high-density interconnect structure.

Figure 1A:
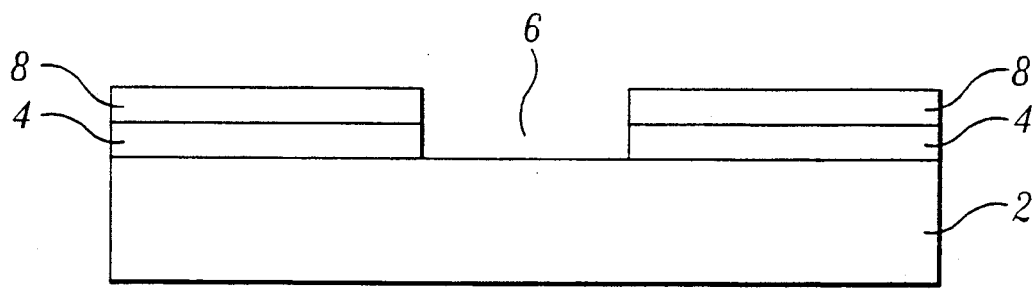
FIGS. 1A-1F are schematic cross-sectional views representing the sequence of steps comprising the method for fabricating one layer of a planar metal/dielectric system. The steps can be repeated to produce a high-density multilayer interconnect structure.

Attention is now directed to the drawings, which depict structures produced by a sequence of steps that may be utilized to fabricate a layer of an interconnect structure by way of a preferred method in accordance with the present invention. Referring to FIG. 1A, substrate 2 has deposited thereon a plating base metal layer 4 which has been patterned. As a result of patterning, gaps or spaces 6 are present between portions of the base metal layer. The coated substrate shown in FIG. 1A is typically produced by depositing a blanket layer of metal onto the substrate 2, such as by sputtering or electron beam evaporation. Preferably, the substrate is an oxidized silicon wafer. The base metal layer 4 is preferably gold or copper. The thickness of the base metal layer can vary depending upon its application; typically, the thickness will range from 2,500 to 6,500 angstroms. The base metal layer deposited on the substrate 2 is patterned by dry and/or wet etching techniques, which are standard in the art of microcircuitry. An adhesion metal layer (e.g., of titanium or chromium) is usually deposited between base metal layer 4 and the oxidized silicon wafer substrate 2 to ensure adequate adherence. The preferred etch mask is a photoresist shown in FIG. 1A as 8. After patterning the plating base metal, the structure shown in FIG. 1A results.

A layer of microfuse material 10 is deposited in gap 6 of FIG. 1A. The material 10 filling gap 6 is conductive zinc metal. The zinc metal may include incidental impurities or additives as long as it remains suitably conductive and oxidizable to function in the present methods. A preferred method of depositing the zinc metal is by electron beam deposition. Another possible method of depositing the zinc metal is by sputtering. The thickness of the layer of zinc metal depends on the thickness of the base metal layer, and is selected to overcome possible step coverage difficulty. In other words, if the conductive metal layer is too thin, then the sidewall of the plating base metal will be incompletely covered, thus producing a high resistance region where premature disconnection can take place.

Preferably, prior to depositing the zinc metal layer, an adhesion layer is coated on substrate 2 at the bottom of gap 6 shown in FIG. 1A. The preferred adhesion layer is a thin layer of silicon. Preferably, the silicon adhesion layer will have a thickness of about 50 angstroms plus or minus 10 angstroms. The thickness of the zinc metal layer that is subsequently deposited on top of the silicon adhesion layer will typically range from about 1,000 angstroms to about 6,000 angstroms.

Also preferably, after depositing the zinc layer 10, a protection layer is deposited on top of the zinc layer. The protection layer will typically have a thickness ranging from about 700 angstroms to 1,200 angstroms. The purpose of the protection layer is to protect the zinc layer from premature conversion to an insulating state, such as by oxidation of the zinc layer. The protection layer is preferably a layer of silicon. When silicon adhesion and protection layers are utilized in conjunction with a zinc layer, the resulting microfuse will have a Si/Zn/Si structure.

Figure 1B:
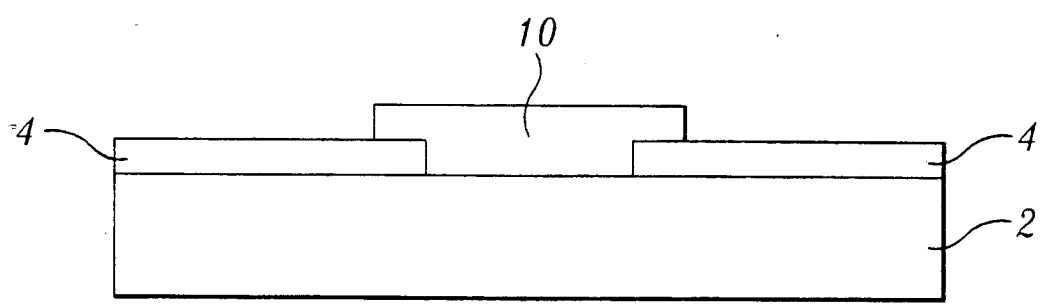
Figure 1C:
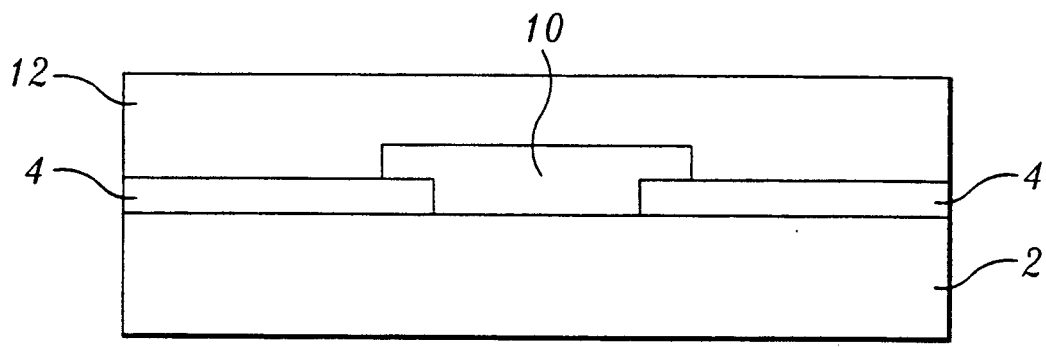

The next step is to deposit a dielectric layer shown as 12 in FIG. 1C on top of the substrate structure shown in FIG. 1B. The specific nature of the dielectric of the present invention is not critical. Photosensitive polyimides are preferred for high-density interconnects; however, nonphotosensitive polyimides patterned by other means also may be used. Other methods for patterning alternate dielectrics include wet chemical, reactive ion, ion milling, or laser etching.

The unexposed photosensitive polyimides are readily soluble in developing solvents used in the photolithographic patterning art, such as gamma-butyrolactone, cyclopentanone, cyclohexanone, and the like. The resistance of the photosensitive polyimide to dissolution by developing solvents can be greatly increased by irradiating the polyimides with ultraviolet radiation. The polyimide dielectric may be applied by spin coating or extrusion coating onto the substrate.

Examples of preferred photosensitive polyimides are those commercially available under the trademark PROBIMIDE TM 400 Series from the Ciba-Geigy Corporation. Other examples include PAL, produced by Hitachi Chemicals; PYRALIN TM PD, produced by E. I. DuPont de Nemours & Co.; and PHOTONEECE TM, produced by Toray Industries, and the like.

Figure 1D:
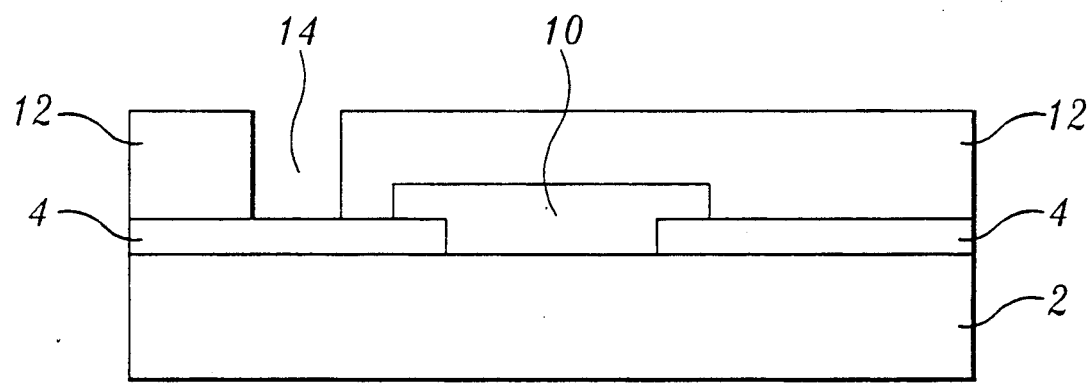

Patterning of the photosensitive polyimide produces trenches 14 as shown in FIG. 1D. Thus, the photosensitive polyimide film defines the conductor pattern to be plated. Additionally, the photosensitive polyimide film serves as the passivation layer for the microfuse disconnect system (comprising the zinc conductor layer and, preferably additionally, the adhesion and protection layers), and also as the dielectric material between two adjacent conductor lines.

If necessary, the patterned structure shown in FIG. 1D is then baked in an inert gas oven. Oven temperature is typically ramped from room temperature to 250° C., held constant for about two to three hours, and then cooled to room temperature. Heating at this stage is carried out so as to chemically harden the photosensitive polyimide to withstand the acids in the electroplating bath while not substantially affecting the microfuse conductance. Thus, the microfuse is still capable of conducting electricity after this step.

Figure 1E:
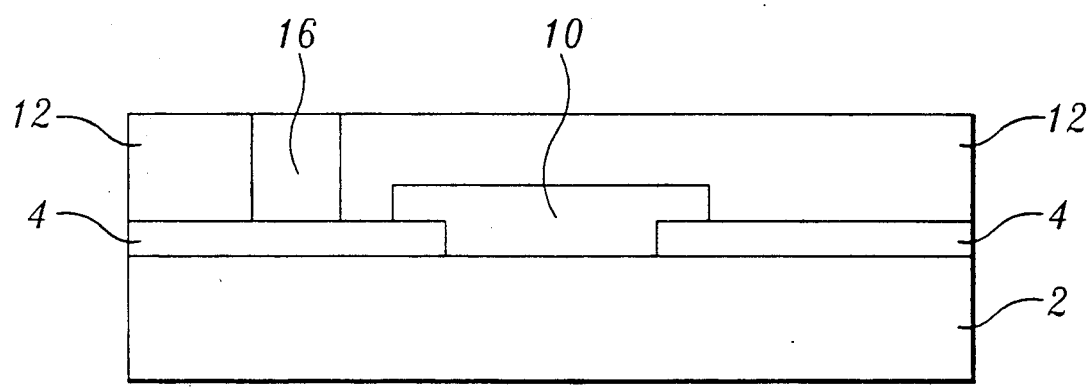

Next, the conductor lines 16 are electroplated into trenches 14 as shown in FIG. 1E. To prepare the base metal layer 4 in FIG. 1D for electroplating, the exposed portion of base metal layer 4 at the bottom of feature 14 may be treated so as to remove at least several monolayers thereof, in the manner set forth in U.S. Ser. No. 07/312,890, filed Feb. 17, 1989, which is incorporated by reference herein. Removal of several monolayers of the base metal layer has been found to improve adhesion of the conductive feature to the base metal layer.

The electrically conductive metal is deposited in trench 14 using standard electroplating techniques. The electroplating process is controlled by standard methodology so as to plate the electrically conductive metal to a thickness approximately equal to the height of the polyimide steps 12 surrounding trench 14.

Figure 1F:
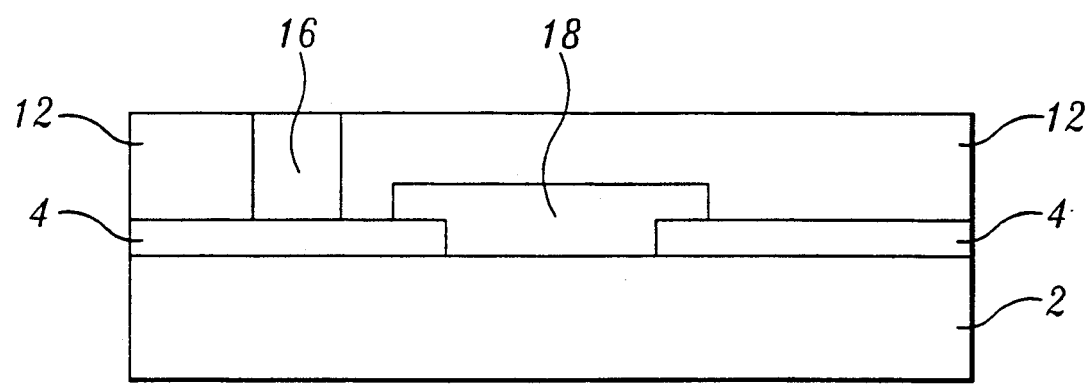

The next step is to bake the wafer shown in FIG. 1E at a temperature sufficient to convert zinc layer 10 into an insulating state. For example, the wafer shown in FIG. 1E can be baked at a temperature of at least about 400° C. for about one hour or more. In addition to thermally transforming the zinc layer into an insulating layer, this baking step also serves to cure the polyimide dielectric 12. As noted above, this step is believed to render the zinc layer 10 insulating by substantial conversion into a zinc oxide layer (18 in FIG. 1F). Due to insulating layer 18, features such as 16 are isolated from other conductive features such as plating base 4.

After the final baking step to convert the zinc layer to an insulating state, the electrical conductivity of the microfuse may be checked. The resistance of the microfuse at this stage depends upon the thickness of the zinc layer used. It will be very resistive when the zinc layer thickness is around 1,000 angstroms or less. However, an extra thermal baking step may be required if the conductor thickness is between about 1,000 and 2,000 angstroms.

For zinc layer thicknesses of greater than about 2,000 angstroms, it may be necessary to bake the wafer in a wet nitrogen environment at a temperature of at least about 250° C. for about two to three hours with silicon nitride as a mask material for adequate conversion to the insulating state.

A multilayer electroplated metal/dielectric interconnect structure may be fabricated by repeating the above-described fabrication sequence for each of several layers. For example, when microelectronic circuits, such as high-density multilayer interconnect structures, are prepared in accordance with the present invention, one layer of the dielectric composition serves the base for another layer of the dielectric composition, including another set of conductor lines. After the conductor lines have been electroplated into the initial features 14, another layer of the dielectric composition can be provided on top of the initial layer by conventional means such as spin coating. Onto this layer can be deposited another set of conductor lines as described above.

Having described the invention in general terms, the same will be better understood by referring to the following examples, which are presented to assist one of ordinary skill in the art in making and using the invention. These examples are not intended in any way to limit the scope of the disclosure or the protection granted by Letters Patent hereon.

EXAMPLES

Numerous experiments have been conducted to optimize the thickness of the conductive zinc layer in various situations. The following table shows the typical resistance change of several silicon/zinc microfuses at various stages:

| Si/Zn/Si Thickness Å | Resistance (25° C.) Ω/sq. | Resistance (250° C.) Ω/sq. | Resistance (400° C.) Ω/sq. |
| --- | --- | --- | --- |
| 50/1K/800 | 2.73 | 3.63 | $3.0 \times 10^9$ |
| 50/1K/850 | 2.93 | 4.55 | $4.0 \times 10^9$ |
| 50/2K/700 | 1.48 | 7.10 | $5.6 \times 10^9$ |
| 50/2K/750$^{(a)}$ | 6.03 | 7.76 | $2.0 \times 10^6$ |
| 50/3K/600$^{(b)}$ | 3.24 | 6.35 | $1.4 \times 10^6$ |

Figure 2:
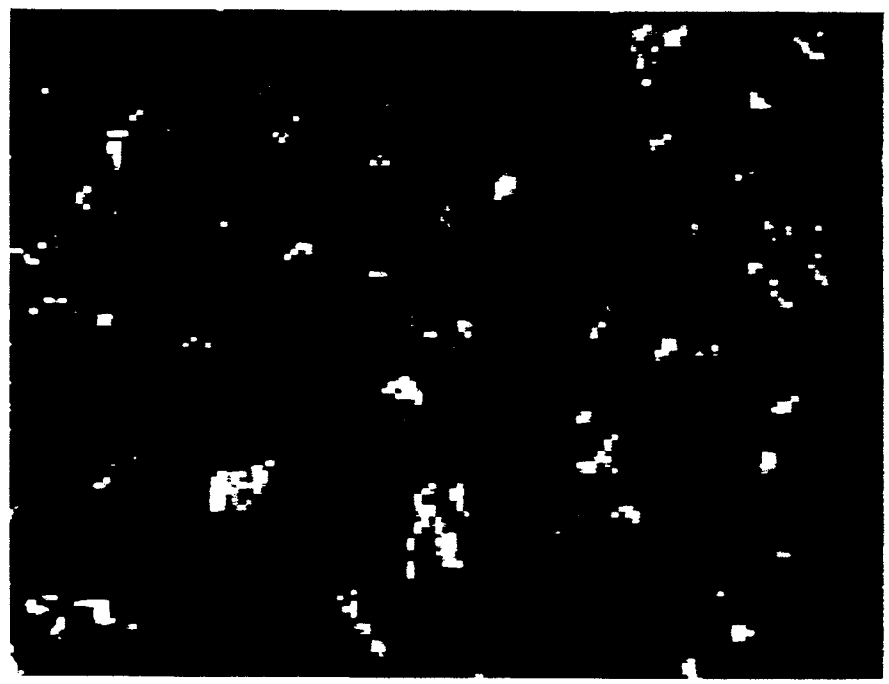
FIGS. 2-4 show micrographs of Auger mapping on a disconnected microfuse of the present invention. The white areas in FIGS. 2, 3, and 4 represent zinc, oxygen, and silicon, respectively.
Figure 3:
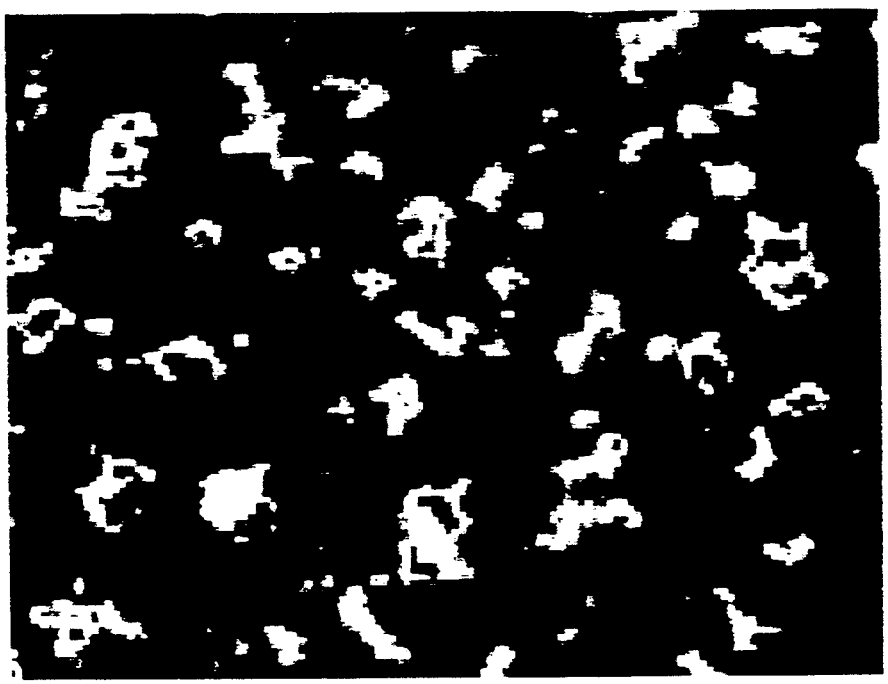
Figure 4:
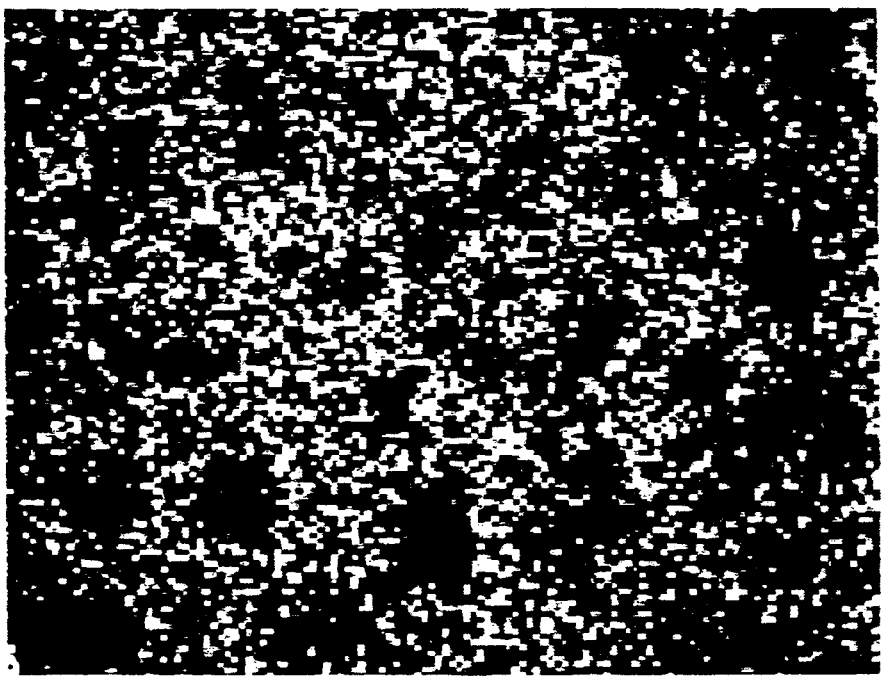

Note: Both wafer (a) and (b) became very resistive after an additional 250° C. bake in wet nitrogen environment. Resistance is in gigaohm regime The data shown in FIGS. 2–4 are the Auger data of a disconnected silicon/zinc/silicon microfuse. Auger analysis reveals chemical composition information as a function of depth up to about 20 to 30 angstroms. Using an ion gun, one can sputter the surface layer away, thus exposing a new surface for chemical analysis. By alternatingly analyzing the surface layer and by ion beam sputtering, one can obtain information on the elemental composition of a thin film as a function of its depth. The Auger data in FIGS. 2–4 indicate that zinc oxidation is the mechanism of disconnection. After baking to 400° C., the zinc conductor collects into islands about 3 μm across which are separated by about 6 μm with silicon in between. The zinc becomes oxidized, but the silicon does not. The Auger analysis can also take place over a certain area by rastering the primary electron beam. Thus, an elemental map can be composed of a certain area in the sample, such as the ones shown in FIGS. 2–4.

The above-described silicon/zinc system is very flexible; each individual layer thickness can be tailored to fit different situations. Thus, the possible step coverage problem is eliminated in this material system.

Figure 5:
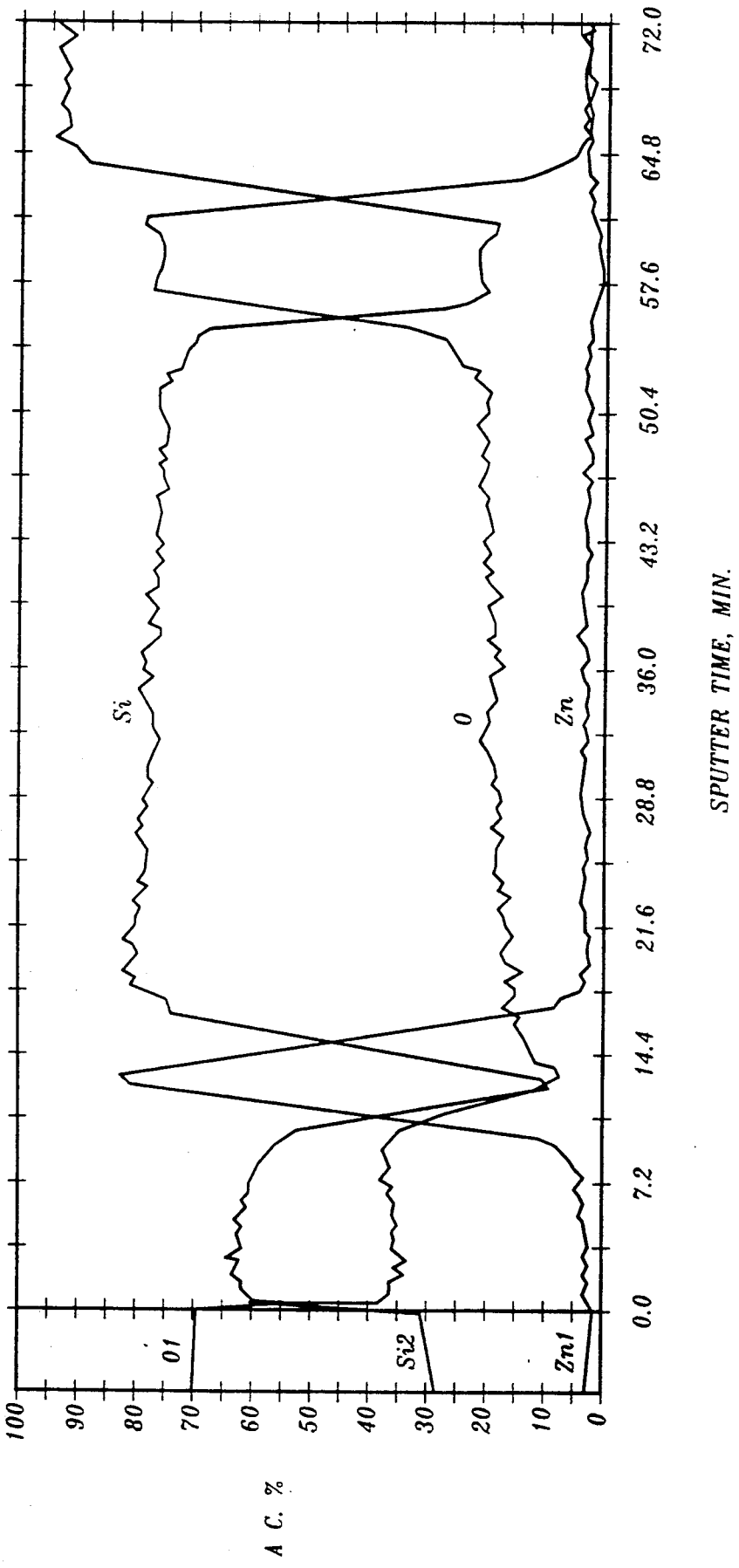
FIG. 5 shows an Auger elemental depth profile of a Si/Zn/Si microfuse as deposited, having the following thicknesses, respectively: 500 Å/1k Å/1500 Å.
Figure 6:
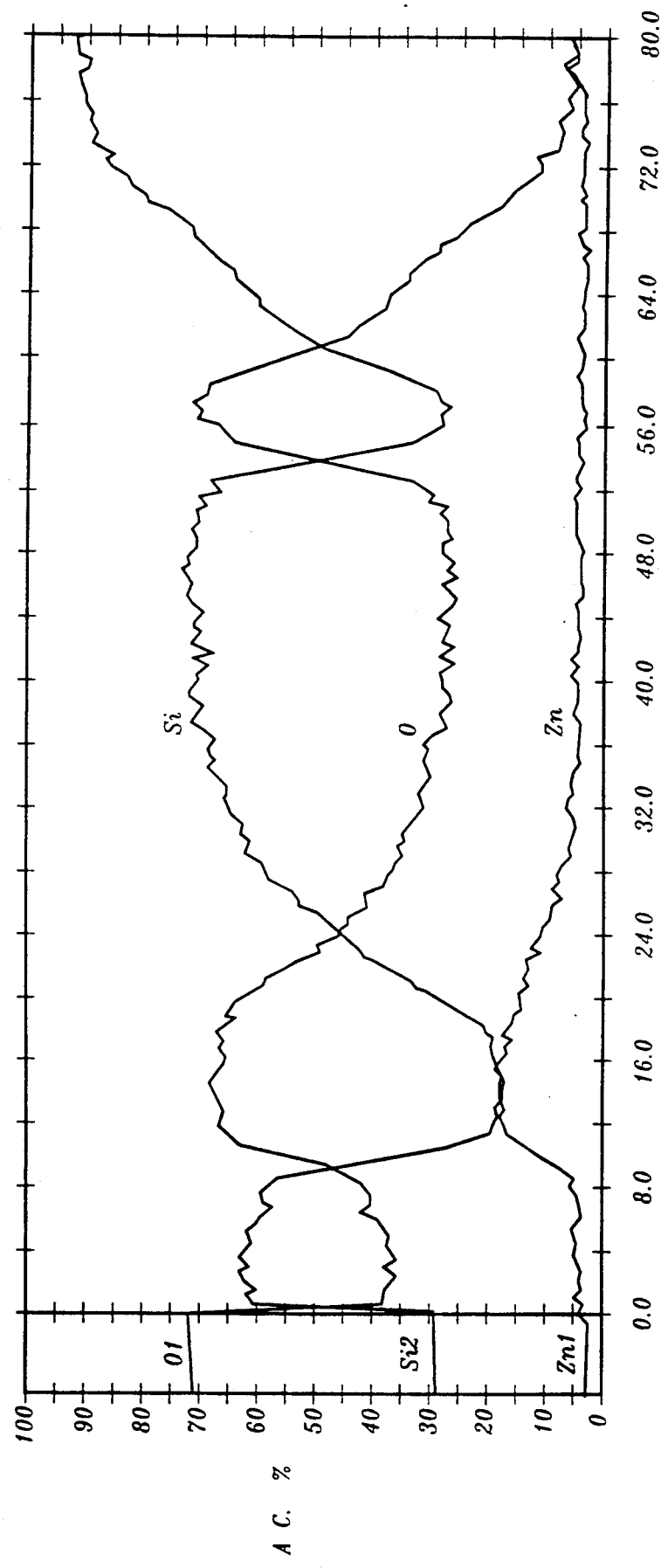
FIG. 6 show an Auger elemental depth profile of Si/Zn/Si microfuse after baking at 400° C. to disconnect the microfuse.

FIGS. 5 and 6 show Auger elemental depth profiles of a Si/Zn/Si microfuse as deposited (FIG. 5) and after baking at 400° C. to cause disconnection (FIG. 6).

While the present invention has been described in relation to various embodiments, including the preferred embodiments and parameters, after reading the foregoing specification, one of ordinary skill in the art will be able to effect various changes, substitutions of equivalents, and other alterations without departing from the broad concepts disclosed herein. It is therefore intended that the scope of Letters Patent granted hereon will be limited only by the definition contained in the appended claims and equivalents thereof.

The embodiments of the invention in which an exclusive property or privilege is claimed are defined as follows:

1. A method of electrically isolating conductive features on a substrate, comprising:
    providing a substrate having thereon a plurality of electrically conductive features, which are maintained in electrical contact by a conductive layer comprising zinc; and
    converting said layer comprising zinc into an electrically insulating state, whereby said conductive features are electrically isolated.

2. The method according to claim 1, wherein said substrate is a wafer comprising silicon.

3. The method according to claim 1, wherein said causing is carried out by heating said layer comprising zinc at a temperature of at least about 400° C. for at least about 1 hour.

4. The method according to claim 1, which is carried out on at least one layer of a high-density interconnect structure.

5. The method according to claim 1, wherein said electrically conductive features are copper lines that have been electroplated on said substrate.

6. A method of fabricating a layer of a multilayer high-density interconnect structure, said method comprising the steps of
    providing a substrate having thereon a patterned conductive base metal layer;
    depositing a conductive layer comprising zinc on said patterned base metal layer to electrically connect patterned portions of said base metal layer;
    coating said substrate with a dielectric layer;
    patterning features into said dielectric layer;
    electroplating a conductive metal into said features; and then
    baking said substrate to convert said layer comprising zinc to an insulating state; thereby electrically isolating the electroplated conductive metal features.

7. The method according to claim 6, wherein said substrate comprises oxidized silicon, said base metal layer comprises gold or copper, said dielectric comprises a polyimide, and said conductor comprises copper.

8. The method according to claim 6, wherein said method further comprises:
    between said providing and depositing steps, applying an adhesion layer in locations where said layer comprising zinc is to be deposited to enhance adhesion of said layer comprising zinc to said substrate; and
    after depositing said layer comprising zinc, creating a protection layer on exposed surfaces of said layer comprising zinc to thereby protect said layer comprising zinc from oxidation prior to said baking step.

9. The method according to claim 8, wherein said adhesion layer comprises silicon.

10. The method according to claim 9, wherein said adhesion layer comprises evaporated silicon having a thickness of about 20 to 70 Å.

11. The method according to claim 8, wherein said protection layer comprises silicon.

12. A silicon substrate having thereon a plurality of electrically conductive features which are maintained in electrical contact by conductive layers comprising zinc, wherein said features may be rendered electrically isolated upon conversion of said layers to an insulating state.

13. An interconnect structure comprising a plurality of layers according to claim 12 on a silicon substrate.

14. An interconnect structure comprising a plurality of layers according to claim 12 which have been treated so as to isolate said electrically conductive features, on a silicon substrate.

15. A layer suitable for use in a multilayer high-density interconnect structure prepared by the method of claim 6.

* * * * *